(12) United States Patent
Nakano

(10) Patent No.: US 10,804,169 B2
(45) Date of Patent: Oct. 13, 2020

(54) SEMICONDUCTOR DEVICE

(71) Applicant: Mitsubishi Electric Corporation, Tokyo (JP)

(72) Inventor: Seiya Nakano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/317,916

(22) PCT Filed: Nov. 8, 2016

(86) PCT No.: PCT/JP2016/083068
§ 371 (c)(1),
(2) Date: Jan. 15, 2019

(87) PCT Pub. No.: WO2018/087807
PCT Pub. Date: May 17, 2018

(65) Prior Publication Data
US 2019/0295907 A1 Sep. 26, 2019

(51) Int. Cl.
*H01L 21/66* (2006.01)
*H01L 23/00* (2006.01)
*H01L 21/283* (2006.01)

(52) U.S. Cl.
CPC ............ *H01L 22/30* (2013.01); *H01L 21/283* (2013.01); *H01L 22/12* (2013.01); *H01L 24/03* (2013.01);
(Continued)

(58) Field of Classification Search
CPC .......... H01L 22/12; H01L 2224/05655; H01L 2224/02215; H01L 2224/03464; H01L 2224/037; H01L 2224/0221; H01L 24/03
See application file for complete search history.

(56) References Cited

U.S. PATENT DOCUMENTS

| 9,735,074 B1 * | 8/2017 | Sekine ................... H01L 23/04 |
| 2016/0005703 A1 | 1/2016 | Nakata et al. |
| 2016/0064312 A1 * | 3/2016 | Bando ..................... H01L 24/40 |
| | | 438/119 |

FOREIGN PATENT DOCUMENTS

| JP | S52-144336 A | 12/1977 |
| JP | S62-040735 A | 2/1987 |

(Continued)

OTHER PUBLICATIONS

International Search Report; Written Opinion; and Notification of Transmittal of the International Search Report and the Written Opinion of the International Searching Authority, or the Declaration issued in PCT/JP2016/083068; dated Jan. 31, 2017.

(Continued)

*Primary Examiner* — Jasmine J Clark
(74) *Attorney, Agent, or Firm* — Studebaker & Brackett PC

(57) ABSTRACT

A semiconductor device includes a surface metal formed on a substrate, a first protective film formed on the surface metal, a second protective film having a first portion provided on the first protective film and a second portion continuing to the first portion and provided on the surface metal and being transparent to light, and a metal film having a main body portion provided on the surface metal and a run-on portion continuing to the main body portion and running onto the first protective film, wherein the main body portion is thicker than the first protective film, the first portion is thicker than the run-on portion, and the second portion is thicker than the main body portion.

18 Claims, 10 Drawing Sheets

(52) U.S. Cl.
CPC ...... *H01L 24/05* (2013.01); *H01L 2224/0221* (2013.01); *H01L 2224/02206* (2013.01); *H01L 2224/02215* (2013.01); *H01L 2224/037* (2013.01); *H01L 2224/03464* (2013.01); *H01L 2224/05655* (2013.01)

(56) References Cited

FOREIGN PATENT DOCUMENTS

| | | |
|---|---|---|
| JP | 2000-260842 A | 9/2000 |
| JP | 2008-182074 A | 8/2008 |
| JP | 2010-272711 A | 12/2010 |
| WO | 2014/136303 A1 | 9/2014 |

OTHER PUBLICATIONS

An Office Action by the Japanese Patent Office dated Jan. 28, 2020, which corresponds to Japanese Patent Application No. 2018-549653 with English Translation.

\* cited by examiner

SEMICONDUCTOR DEVICE

FIELD

The present invention relates to a semiconductor device for use, for example, in switching large electric power.

BACKGROUND

Patent Literature 1 discloses that in a semiconductor device for switching large current, a connection between an electrode of a semiconductor device and an external electrode needs to be suitable for large current. Patent Literature 2 discloses that an external electrode, which is a copper plate, and an electrode of a semiconductor device are directly connected together through soldering. This can realize the connection enabling large current energization while reducing electric resistance.

Patent Literature 3 discloses that the reliability in solder connection is enhanced by forming an Ni layer of an appropriate thickness as a metal film for solder connection. The process validity can be better compatible with the connection reliability by optimizing the Ni thickness.

PRIOR ART

Patent Literature

Patent Literature 1: International Publication No. 2014/136303
Patent Literature 2: JP 2008-182074 A
Patent Literature 3: JP 2010-272711 A

SUMMARY

Technical Problem

There is a case where an Ni film having a thickness of 1.5 µm or larger, for example, is formed on an electrode of a semiconductor device for use as a metal film for solder connection. There is a merit in cost in forming such a metal film through an electroless plating method rather than through a lift off method. However, when forming a metal film through the electroless plating method, compared with forming a metal film through the lift off method, there is caused a problem in that a thickness of a metal film varies largely among wafers within one lot, and a thickness of a metal film also varies largely within a surface of a wafer.

As described in the patent literature mentioned above, the thickness of the metal film is required to stay within the predetermined range to enhance the reliability. To this end, it is desirable to verify that thicknesses of metal films on chips stay within the predetermined range through a total inspection of the chips as an ideal. For example, a fluorescent X-ray analysis method is used as a known non-destructive measurement method. The fluorescent X-ray measurement method is a method in which a fluorescent X-ray which is emitted from a plating film irradiated with X-rays is detected to compare the thickness of the plating film with that of a known reference sample. However, since a total inspection of all the manufactured semiconductors for thickness calls for an increase in processing time, such a total inspection should be avoided. Due to this, a semiconductor which can easily determine whether or not a thickness of a metal film is reasonable has been in demand.

The present invention has been made with a view to solving the problem described above, and an object of the present invention is to provide a semiconductor device which can easily determine whether or not a thickness of a metal film for use mainly in bonding connection with an external electrode is reasonable.

Means for Solving the Problems

According to a present invention, a semiconductor device includes a surface metal formed on a substrate, a first protective film formed on the surface metal, a second protective film having a first portion provided on the first protective film and a second portion continuing to the first portion and provided on the surface metal and being transparent to light, and a metal film having a main body portion provided on the surface metal and a run-on portion continuing to the main body portion and running onto the first protective film, wherein the main body portion is thicker than the first protective film, the first portion is thicker than the run-on portion, and the second portion is thicker than the main body portion.

According to another aspect of the present invention, a semiconductor device includes a surface metal formed on a substrate, a first reference protective film formed on the surface metal, a second reference protective film formed on the surface metal and having an area which is smaller than that of the first reference protective film, a support protective film configured to cover partially the first reference protective film and the second reference protective film, and a metal film having a main body portion provided on the surface metal, a second run-on portion continuing to the main body portion and running onto an entire portion of an upper surface of the second reference protective film which is not covered by the support protective film, and a first run-on portion continuing to the main body portion and running onto part of a portion of an upper surface of the first reference protective film which is not covered by the support protective film.

According to another aspect of the present invention, a semiconductor device includes a surface electrode formed on a substrate, an external electrode soldered to the surface electrode, and a thickness monitor formed on the substrate, wherein the thickness monitor has a plurality of pads provided at different intervals and a monitor metal covering the plurality of pads and formed of the same material as a material of which the surface electrode is formed.

According to another aspect of the present invention, a semiconductor device includes a surface electrode formed on a substrate, an external electrode soldered to the surface electrode, and a thickness monitor formed on the substrate, wherein the thickness monitor includes a first pad formed on the substrate, a second pad formed on the substrate and formed so as to be spaced away from the first pad, a first wiring connected to the first pad, a second wiring connected to the first pad, a third wiring connected to the second pad, a fourth wiring connected to the second pad, a first metal formed on the first wiring, a second metal formed on the second wiring, a third metal formed on the third wiring, and a fourth metal formed on the fourth wiring, wherein a distance between the first wiring and the third wiring differs from a distance between the second wiring and the fourth wiring, and wherein the surface electrode, the first metal, the second metal, the third metal and the fourth metal are formed of the same material.

Advantageous Effect of Invention

According to the present invention, whether or not the thickness of the metal film is reasonable can easily be determined by observing a run-on amount of the metal film by which the metal film runs onto the protective film or determining on the thickness of the metal film through measurement of the electric characteristic of the metal film.

DESCRIPTION OF EMBODIMENTS

Figure 1:
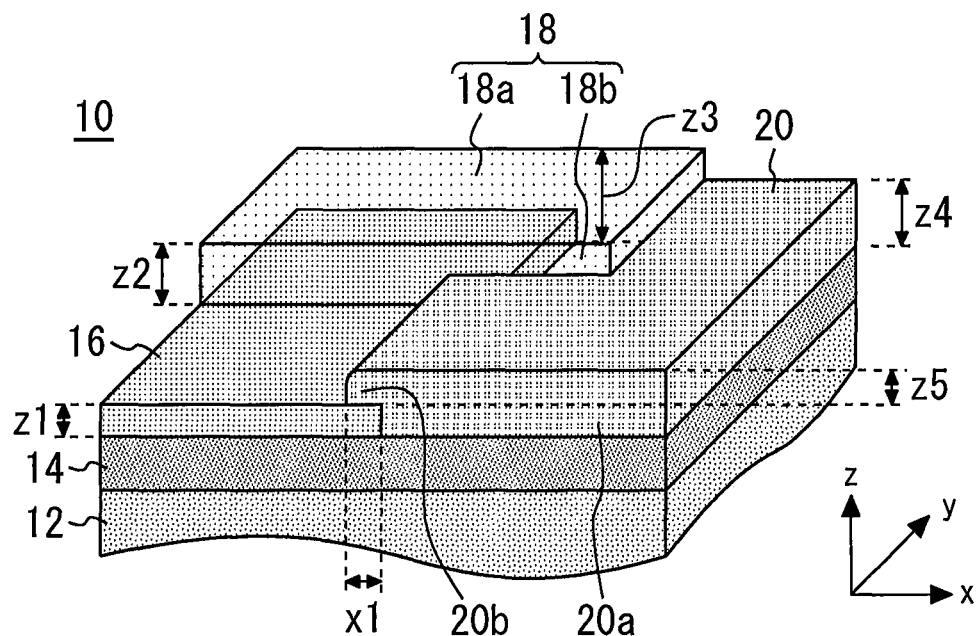
FIG. 1 is a perspective view illustrating thickness monitor of the first embodiment.

Semiconductor devices according to embodiments of the present invention will be described by reference to drawings. Like reference numerals will be given to like or corresponding constituent elements, so that repetitions of the same descriptions will be omitted.

First Embodiment

FIG. 1 is a perspective view illustrating part of a semiconductor device according to a first embodiment. This semiconductor device includes a substrate 12 on which, for example, a transistor or a diode is formed. A surface metal 14 is formed on the substrate 12. A material used for the surface metal 14 is aluminum, for example. The surface metal 14 is formed as a main electrode through which a main current flows. A first protective film 16 is formed on the surface metal 14. The first protective film 16 is formed on part of the surface metal 14. The first protective film 16 is formed of a material in which a plating film is not grown or a non-plating material. In addition, the first protective film 16 is preferably stable against a plating treatment and preferably does not deteriorate even though the first protective film 16 is subject to a plating treatment. Glass, SiN, Ti or W can be used as a material for the first protective film 16. The first protective film 16 may not be formed of an inorganic material.

A second protective film 18 is provided which has a first portion 18a provided on the first protective film 16 and a second portion 18b continuing to the first portion 18a and provided on the surface metal 14. The first portion 18a covers partially the first protective film 16. The second portion 18b is formed on part of the surface metal 14. The second protective film 18 is formed of a material in which a plating film does not grow or a non-plating material. The second protective film 18 is preferably stable against a plating treatment. In addition, the second protective film 18 is formed of a material which is transparent to light. For example, polyimide is used as a material for the second protective film 18.

A metal film 20 is formed on a portion of the surface metal 14 where neither the first protective film 16 nor the second protective film 18 is formed. The metal film 20 has a main body portion 20a provided on the surface metal 14 and a run-on portion 20b continuing to the main body portion 20a and running onto the first protective film 16. The run-on portion 20b runs onto the first protective film 16 over a distance x1. The main body portion 20a is thicker than the first protective film 16. That is, a thickness z4 of the main body portion 20a is larger than a thickness z1 of the first protective film 16. The thickness z1 of the first protective film 16 is preferably sufficiently smaller than the thickness z4 of the main body portion 20a. For example, the thickness z1 of the first protective film 16 is desirably equal to or smaller than a half of the thickness z4 of the main body portion 20a.

The first portion 18a is thicker than the run-on portion 20b. That is, a thickness z5 of the run-on portion 20b is smaller than a thickness z2 of the first portion 18a. The second portion 18b is thicker than the main body portion 20a. That is, a thickness z3 of the second portion 18b is larger than the thickness z4 of the main body portion 20a. The second portion 18b is preferably sufficiently thicker than the main body portion 20a. For example, the thickness z3 of the second portion 18b is desirably twice or larger the thickness z4 of the main body portion 20a.

Figure 2:
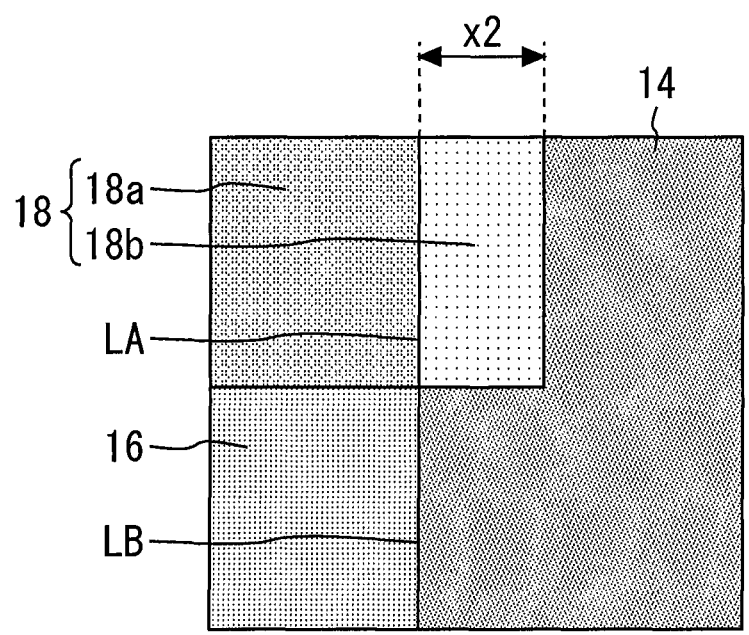
FIG. 2 is a plan view of unfinished thickness monitor.

Next, a method for manufacturing the semiconductor device according to the first embodiment will be described. Firstly, the first protective film 16 and the second protective film 18 are formed on the surface metal 14. FIG. 2 is a plan view of the first protective film 16 and the second protective film 18 which are formed on the surface metal 14. Since the second protective film 18 is formed of the material transparent to light, a reference line LA can be visualized. The reference line LA constitutes a boundary line between the first protective film 16 lying underneath the second protective film 18 and the surface metal 14 lying underneath the second protective film 18 in plan view. Additionally, a contact line LB constitutes a boundary between the first protective film 16 which is not covered by the second protective film 18 and the surface metal 14 in plan view. The reference line LA and the contact line LB constitutes a single straight line.

Figure 3:
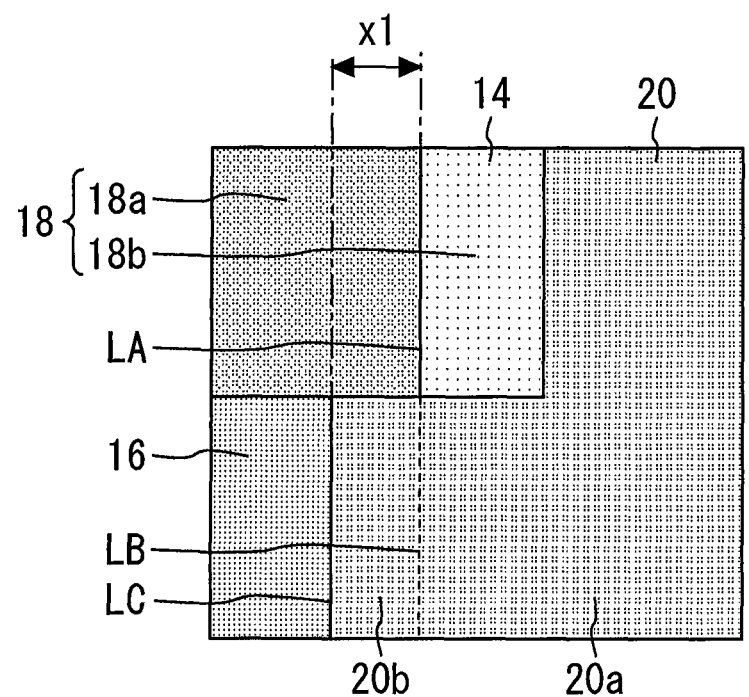
FIG. 3 is a plan view of the thickness monitor.

Next, the metal film 20 is formed through an electroless plating method. The metal film 20 does not grow to the first protective film 16 and the second protective film 18 but grows on the surface metal 14. Since the first protective film 16 and the second protective film 18 have a resistance to the growth of plating, the first and second protective films 16, 18 function as a mask configured to restrict an area where plating is formed. FIG. 3 is a plan view of the semiconductor device after the metal film 20 is formed. In an initial stage of the growth of plating, a shape of the metal film as seen from the top of it is the same as a shape of the surface metal 14 as seen from the top of it. That is, the metal film exists directly on the surface metal 14. Then, plating grows, the metal film 20 runs over the contact line LB onto the first protective film 16. This forms the run-on portion 20b. The metal film 20 is an Ni film having a thickness of 1.5 μm or larger on the main body portion 20a, for example.

When the run-on portion 20b is formed, completing the formation of the metal film 20, the contact line LB constitutes a line which defines a boundary line between the first protective film 16 and the main body portion 20a. The contact line LB becomes invisible due to the metal film 20 having the run-on portion 20b. In FIG. 3, as a matter of convenience in description, the contact line LB is indicated by a broken line. In plan view, a boundary line between the run-on portion 20b and the first protective film 16 is referred to as a measurement line LC. A distance x1 between the measurement line LC and the reference line LA reflects a growing amount of the run-on portion 20b.

Next, whether or not a thickness of the metal film 20 is reasonable is determined. To make this happen, a thickness of the metal film 20 has to be grasped by any method available. A thickness of the metal film 20 is basically equal to a sum of the thickness z1 of the first protective film 16 and the distance x1 between the measurement line LC and the reference line LA. A case where a side surface of the first protective film 16 is erected normal to the surface metal 14, a case where the side surface of the first protective film 16 intersects acutely a surface of the surface metal 14 and a case where the side surface of the first protective film 16 intersects obtusely the surface of the surface metal 14 are assumed, and a calculation method of calculating a thickness of the metal film 20 is ideally changed slightly depending upon the cases. However, to avoid a complex process, the sum of the thickness z1 of the first protective film 16 and the distance x1 between the measurement line LC and the reference line LA should constitute the thickness of the metal film 20.

The thickness z1 of the first protective film 16 is known from processing conditions. Consequently, the thickness of the metal film 20 can be clarified by measuring the distance x1 between the measurement line LC and the reference line LA by use of an image recognition device or visually. When the thickness of the metal film 20 is smaller than a target value, the distance x1 becomes smaller than the target value, whereas when the thickness of the metal film 20 is larger than the target value, the distance x1 becomes larger than the target value. To measure the distance x1, since the reference line LA needs to be a reference, the reference line LA has to be left visible from above the second protective film 18. To make this happen, a projecting amount, of the second protective film 18 from the first protective film 16 is preferably 5 μm or larger. In this way, whether or not the thickness of the metal film 20 is reasonable can be determined by measuring the distance x1 between the reference line LA and the measurement line LC. A semiconductor device or a wafer in which the thickness of the metal film 20 stays within a predetermined range is determined to be good.

Figure 4:
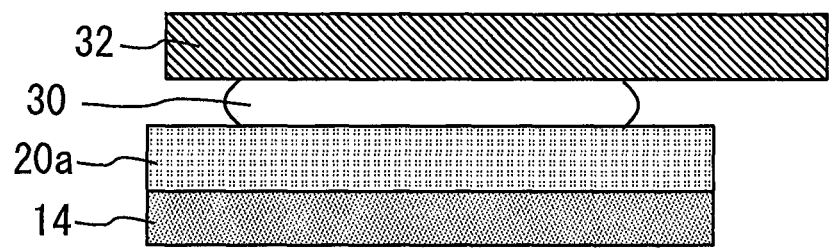
FIG. 4 is a drawing illustrating an external electrode.

Next, an external electrode is soldered to the metal film 20. FIG. 4 is a drawing illustrating an external electrode 32 and the like. The external electrode 32 is fixed to the main body portion 20a of the metal film 20 with solder 30. This can provide a semiconductor device enabling large current energization while reducing electric resistance.

The semiconductor device according to the first embodiment determines whether or not the thickness of the metal film 20 formed by use of the electroless plating method by comparing a positional relationship of the run-on portion 20b which overlaps the first protective film 16 and an end portion of the first protective film 16 lying underneath the second protective film 18. The semiconductor device according to the first embodiment can be modified variously within such an extent that the characteristics of the semiconductor device are lost. For example, in the first embodiment, in plan view, the reference line LA and the contact line LB are described as forming the single straight line; however, the reference line LA and the contact line LB may be arranged parallel. By adopting this configuration, for example, when the run-on portion 20b grows to run over the reference line LA, it can be determined from this fact that a thickness error is occurring. The modified examples described in the first embodiment of the present invention can also be applied to semiconductor devices according to embodiments which will be described below as required.

Second Embodiment

Since a semiconductor device according to a second embodiment of the present invention and the semiconductor device of the first embodiment have many characteristic features in common, different characteristic features of the semiconductor device of the second embodiment will mainly be described. The semiconductor device according to the second embodiment is such that two reference lines are provided, and whether or not a measurement line is situated between the two reference lines is detected.

Figure 5:
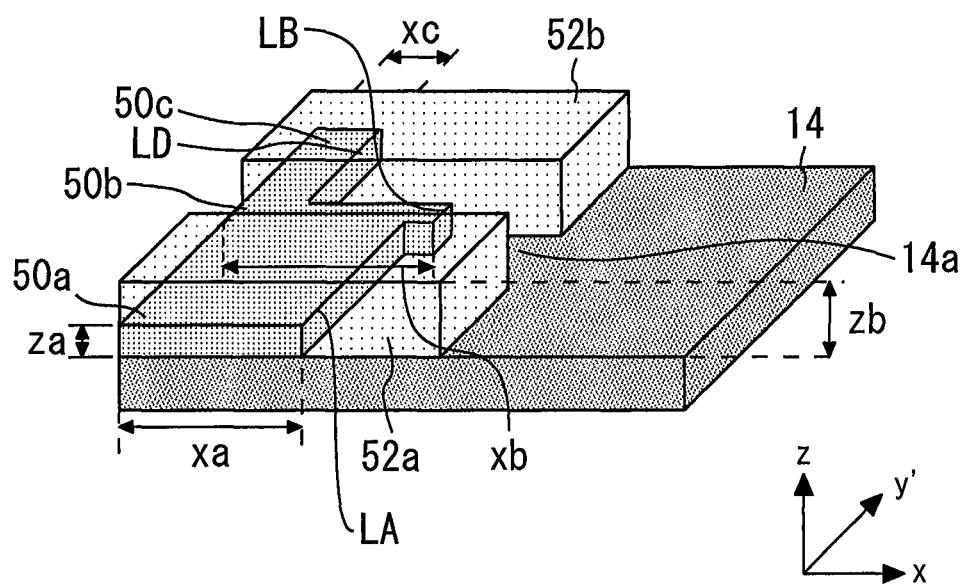
FIG. 5 is a perspective view of a thickness monitor in process of manufacture according to the second embodiment.

A method for manufacturing the semiconductor device according to the second embodiment will be described. FIG. 5 is a perspective view of part of a semiconductor device before a metal film according to the second embodiment is formed on it. Firstly, first protective films 50a, 50b, 50c and second protective films 52a, 52b are formed. The first protective film 50a is covered by the second protective film 52a. The first protective film 50b is not covered by the second protective film and is exposed to the outside. The first protective film 50c is covered by the second protective film 52b.

The first protective films 50a, 50b, 50c are formed integrally and constitute one integral protective film. Consequently, the first protective films 50a, 50b, 50c have the same thickness. A width xb of the first protective film 50b is larger than a width xa of the first protective film 50a and a width xc of the first protective film 50c. The width xa of the first protective film 50a is larger than the width xc of the first protective film 50c. Consequently, the first protective film 50b which is not covered by the second protective film protrudes further than the first protective films 50a, 50c.

Figure 6:
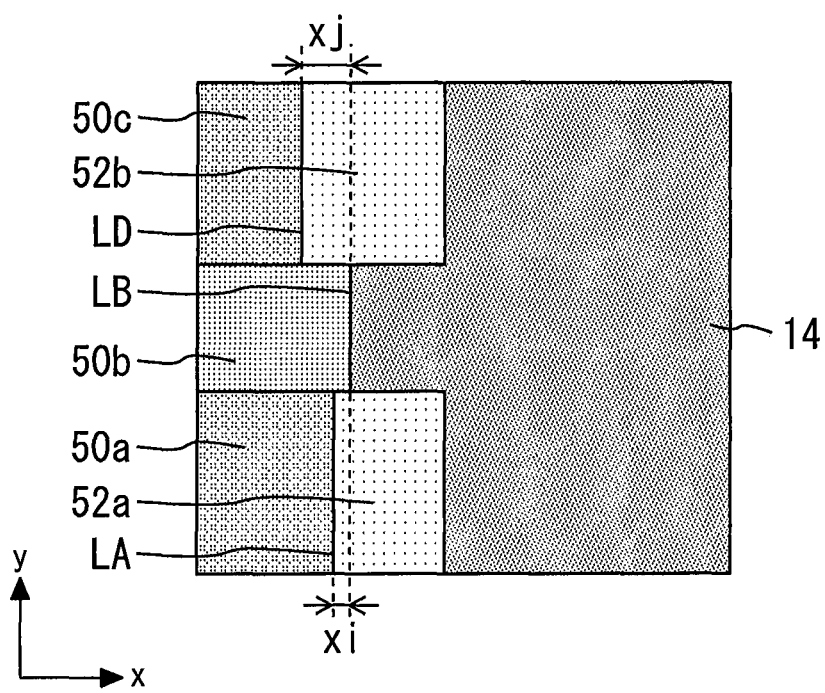
FIG. 6 is a plan view of the monitor illustrated in FIG. 5.

The second protective films 52a, 52b are formed of a material which is transparent to light as with the second protective film of the first embodiment. Consequently, a reference line LA can be visualized through the second protective film 52a, and a reference line LD can be visualized through the second protective film 52b. FIG. 6 is a plan view of the semiconductor device illustrated in FIG. 5. The reference lines LA, LD exist further in an x negative direction than a contact line LB. The two reference lines LA, LD are parallel.

Figure 7:
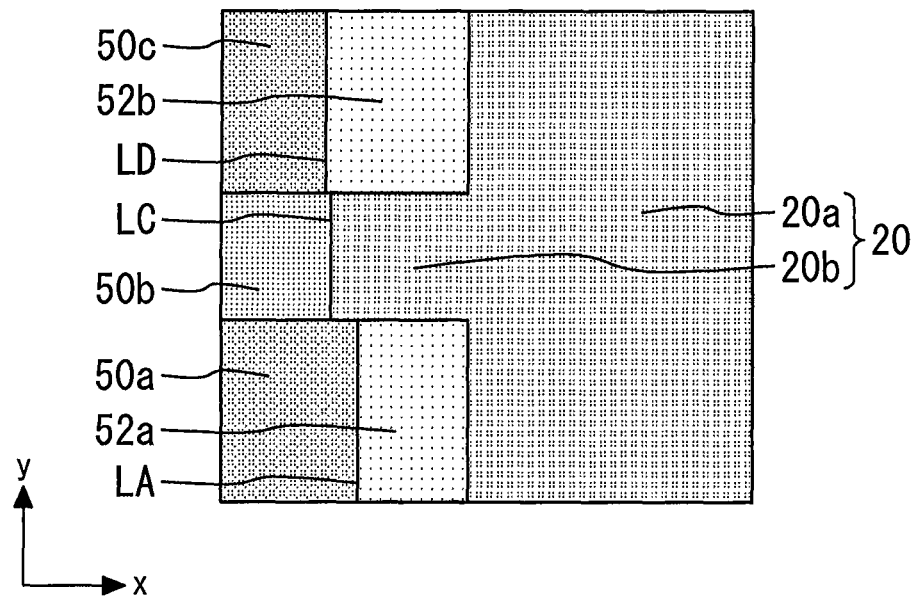
FIG. 7 is a plan view illustrating thickness monitor according to the second embodiment.

Next, a metal film is formed by use of an electroless plating method. FIG. 7 is a plan view illustrating a formed metal film 20. When an electroless plating process progresses, firstly, metal grows on a surface metal, and when the growth of the metal progresses, part of a metal film runs onto the first protective film 50b. A metal film 20 having a main body portion 20a and a run-on portion 20b running onto the first protective film 50b is formed by the electroless plating process. A measurement line LC, which is a boundary line between the run-on portion 20b and the first protective film 50b, is determined as a result of the metal film 20 being so formed.

Only with a configuration in which a position of the measurement line LC where the thickness of the metal film 20 stays at its lower limit value coincides with the position of the reference line LA, a fact that the run-on portion 20b is formed to extend across the lower limit value can be confirmed only by confirming that the run-on portion 20b is formed to extend across the reference line LA. Due to this, in the second embodiment, the position of the reference line LA is determined so that the measurement line LC whose position indicates that the thickness of the metal film 20 stays at its lower limit value and the reference line LA form together a single straight line.

Further, only with a configuration in which a position of the measurement line LC where the thickness of the metal film stays at its upper limit value coincides with the position of the reference line LD, a fact that the metal film 20 does not exceed its upper limit value can be confirmed only by confirming that the run-on portion 20b does not reach the reference line LD. Due to this, in the second embodiment, the position of the reference line LD is determined so that the measurement line LC whose position indicates that the thickness of the metal film 20 stays at its upper limit value and the reference line LD form together a single straight line.

As shown in FIG. 6, a distance xi between the reference line LA and the contact line LB is caused to coincide with a value resulting from deducting the thickness of the first protective films 50a, 50b, 50c from the lower limit value of the thickness of the metal film 20. Additionally, a distance xj between the reference line LD and the contact line LB is caused to coincide with a value resulting from deducting the thickness of the first protective film 50a, 50b, 50c from the upper limit value of the thickness of the metal film 20. That is, the reference line LA corresponds to the lower limit value of the thickness of the metal film 20, and the reference line LD corresponds to the upper limit value of the thickness of the metal film 20. By adopting this configuration, it can be determined only by confirming that the measurement line LC stays between the reference line LA and the reference line LD that the metal film 20 is formed as a good film in which the thickness of the metal film 20 satisfies the thickness standard.

Figure 8:
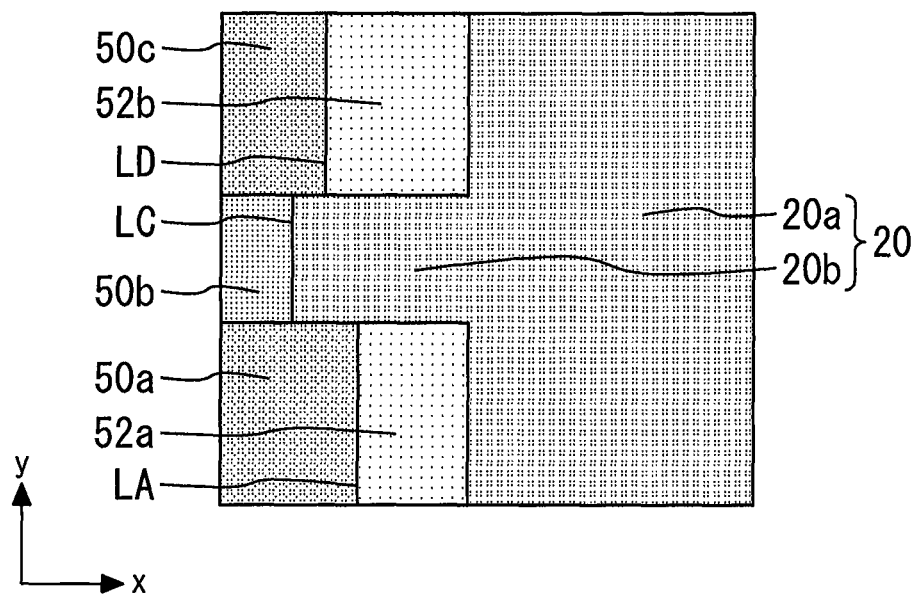
FIG. 8 illustrates the metal film whose thickness is larger than an upper limit.
Figure 9:
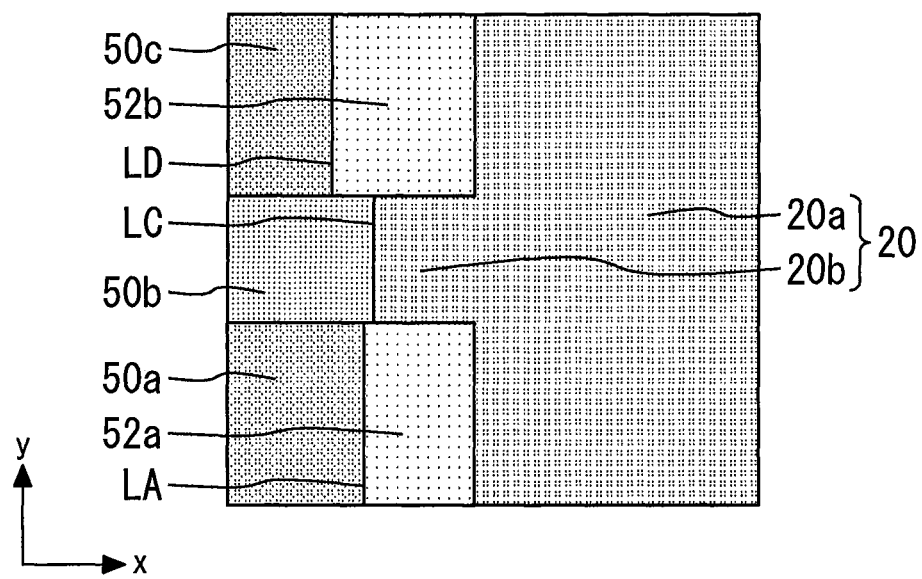
FIG. 9 illustrates the metal film whose thickness is smaller than a lower limit.

For example, as illustrated in FIG. 8, when the measurement line LC extends beyond the reference line LD, it is determined that the thickness of the metal film 20 has grown to exceed the upper limit value of the thickness of the metal film 20. On the other hand, as illustrated in FIG. 9, when the measurement line LC does not reach the reference line LA, it is determined that the thickness of the metal film 20 remains below the lower limit of the thickness of the metal film 20.

In the second embodiment of the present invention, the contact line LB lies closer to the main body portion 20a than the two reference lines LA, LD by causing the first protective film 50b to protrude further than the first protective films 50a, 50c. However, the two reference lines may be used for other applications. For example, two structures like the one illustrated in FIG. 5 are prepared, and a first structure is used to monitor the upper limit of the thickness of the metal film, while a second structure is used to monitor the lower limit of the thickness of the metal film. Specifically, in the first structure, (1) It is determined that the upper limit of the thickness of the metal film is exceeded when the measurement line LC extends beyond the reference line LD;
(2) It is determined that the metal film is not defective but has a thickness which is slightly larger than an ideal thickness when the measurement line LC stays between the reference line LA and the reference line LD; and
(3) It is determined that the thickness of the metal film is sufficiently smaller than the upper limit of the thickness when the measurement line LC does not reach the reference line LA.

On the other hand, in the second structure, (4) It is determined that the thickness of the metal film is sufficiently larger than the lower limit of the thickness when the measurement ling LC extends beyond the reference line LD;
(5) It is determined that the metal film is not defective but has a thickness which is slightly smaller than the ideal thickness when the measurement line LC stays between the reference line LA and the reference line LD; and
(6) It is determined that the thickness of the metal film is below the lower limit of the thickness when the measurement line LC does not reach the reference line LA.

When the metal film corresponds to (1) or (6), the semiconductor device is determined to be defective, when the metal film corresponds to (2) or (5), although the semiconductor device does not have to be determined as defective, it should be recognized that some improvement in the manufacturing process is necessary, and when the metal film corresponds to (3) or (4), the semiconductor device is determined to be good.

According to the semiconductor device of the second embodiment, since the two reference lines LA, LD can be provided by providing the two second protective films 52a, 52b so as to hold the run-on portion 20b therebetween, a highly accurate thickness determination is enabled. A different determination sequence from the method described above may be configured by use of the basic structures.

Third Embodiment

Figure 10:
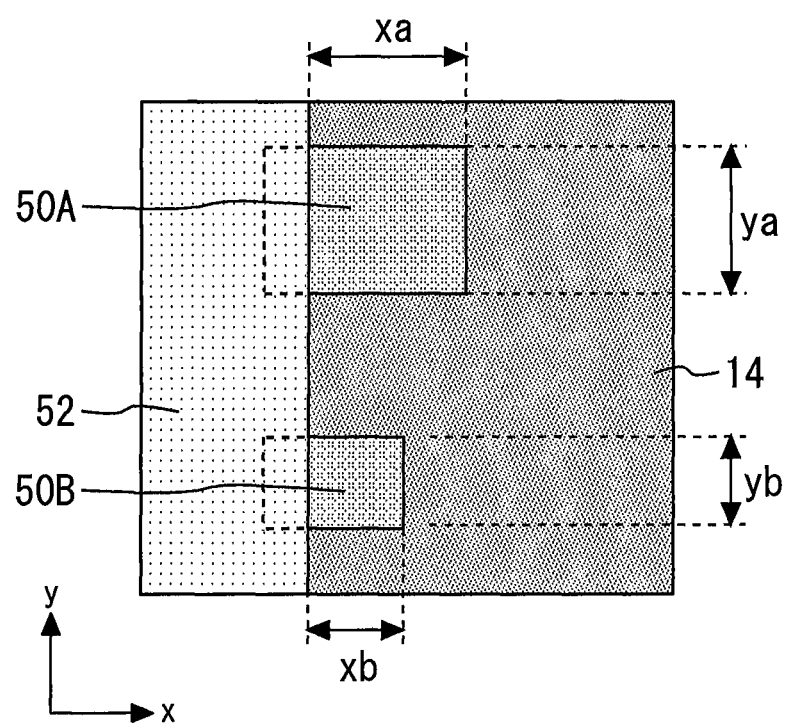
FIG. 10 is a plan view of a thickness monitor in process of manufacture according to the third embodiment.

A method for manufacturing a semiconductor device according to a third embodiment will be described. Firstly, a first protective film and a second protective film are formed. FIG. 10 is a plan view of a semiconductor device before a metal film is formed on it. This semiconductor device has a surface metal 14 formed on a substrate. A first reference protective film 50A and a second reference protective film 50B are formed on the surface metal 14. Part of the first reference protective film 50A and part of the second reference protective film 50B are covered by a support protective film 52. The first reference protective film 50A lying underneath the support protective film 52 is indicated by a broken line, and the second reference protective film 50B lying underneath the support protective film 52 is also indicated by a broken line. The support protective film 52 fixes the first reference protective film 50A and the second reference protective film 50B in such a way that the first and second reference protective films 50A, 50B do not come off during the manufacturing process, and hence, the support protective film 52 does not have to be transparent to light. The first reference protective film 50A and the second reference protective film 50B may be connected together underneath the support protective film 52.

An area of an exposed portion of the second reference protective film 50B is smaller than an area of an exposed portion of the first reference protective film 50A. A vertical length of the first reference protective film 50A is ya, and a horizontal length thereof is xa. A vertical length of the second reference protective film 50B is yb, and a horizontal length thereof is xb. Here, ya is larger than yb, and xa is larger than xb. The area of the exposed portion of the first reference protective film 50A is determined so as to reach an upper limit of a thickness of a metal film when the exposed portion is wholly covered by the metal film. Specifically, ya is determined so that a sum of ya/2 and a thickness of the first reference protective film 50A coincides with the upper limit of the thickness of the metal film. Note that xa can be larger than, for example, ya, whereby the visibility of the exposed portion of the first reference protective film 50A can be enhanced.

On the other hand, the area of the exposed portion of the second reference protective film 50B is determined so as to exceed a lower limit of the thickness of the metal film when the exposed portion is wholly covered by the metal film. Specifically, yb is determined so that a sum of yb/2 and a thickness of the second reference protective film 50B coincides with the lower limit of the thickness of the metal film. Note that xb can be larger than, for example, yb, whereby the visibility of the exposed portion of the second reference protective film 50B can be enhanced.

Figure 11:
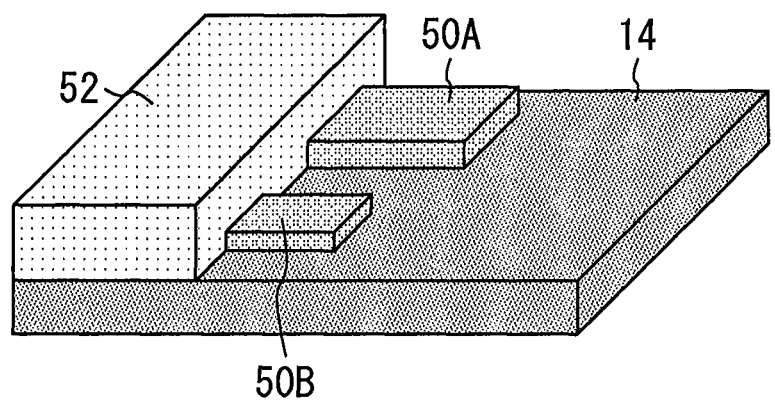
FIG. 11 is a perspective view of the monitor illustrated in FIG. 10.

FIG. 11 is a perspective view of the semiconductor device illustrated in FIG. 10. Since the first reference protective film 50A and the second reference protective film 50B are formed simultaneously, the first reference protective film 50A and the second reference protective film 50B have the same thickness. The support protective film 52 is formed thicker than the first reference protective film 50A and the second reference protective film 50B. The first reference protective film 50A, the second reference protective film 50B and the support protective film 52 are formed of a material such as glass, SiN, Ti, W or polyimide, for example, where a plating film does not grow or a non-plating material.

Figure 12:
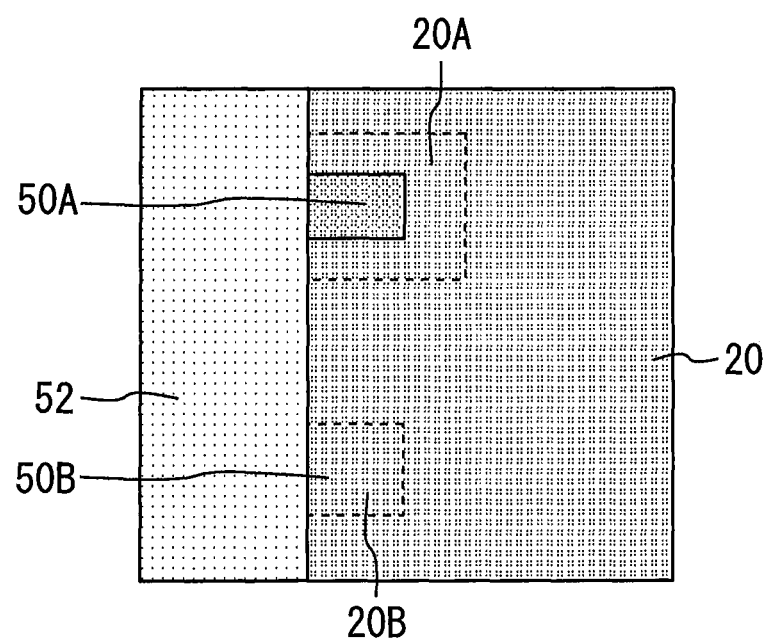
FIG. 12 is a plan view of the thickness monitor.

Next, a metal film is formed. A metal film is formed on the surface metal 14 by use of an electroless plating method. FIG. 12 is a plan view of a metal film 20 formed in that way. In an initial stage of the electroless plating method, the metal film is formed only on the surface metal. When the plating process progresses and a thickness of the metal film 20 exceeds the thickness of the first reference protective film 50A and the second reference protective film 50B, a first run-on portion 20A running onto the first reference protective film 50A and a second run-on portion 20B running onto the second reference protective film 50B are formed. Consequently, the metal film 20 includes a main body portion 20a provided on the surface metal 14, and the first run-on portion 20A and the second run-on portion 20B which connect to the main body portion 20a.

The first run-on portion 20A runs onto part of a portion of an upper surface of the first reference protective film 50A which is not covered by the support protective film 52. The first run-on portion 20A is formed in a U-shape in plan view. Part of the first reference protective film 50A is exposed to the outside. The second run-on portion 20B runs onto the whole of a portion of an upper surface of the second reference protective film 50B which is not covered by the support protective film 52. The second reference protective film 50B is not exposed to the outside.

It can be determined that the thickness of the metal film 20 is smaller than the upper limit by confirming that the metal film 20 does not cover the whole of the first reference protective film 50A with part of the first reference protective film 50A left exposed. Additionally, it can be determined that the thickness of the metal film 20 exceeds the lower limit by confirming that the metal film 20 covers the whole of the second reference protective film 50B. A working person or a determination device can determine by inspecting the metal film 20 illustrated in FIG. 12 that the thickness of the metal film 20 formed in the electroless plating step stays within the controlled standard.

Figure 13:
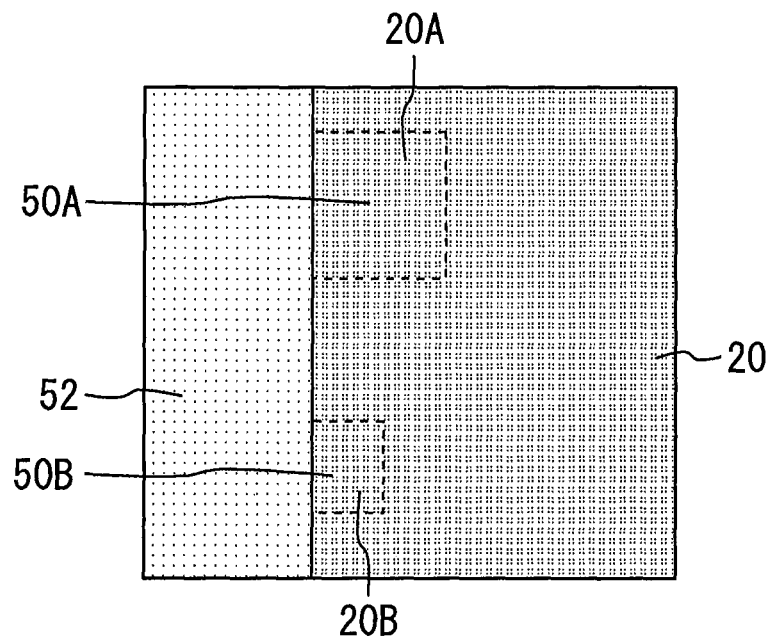
FIG. 13 illustrates the metal film whose thickness is larger than an upper limit.

In the event that the thickness of the metal film 20 exceeds the upper limit, as illustrated in FIG. 13, the whole of the portion of the first reference protective film 50A which is exposed from the support protective film 52 is covered by the metal film 20. As this occurs, neither the first reference protective film 50A nor the second reference protective film 50B is exposed to the outside, and it can be determined by observing this that the thickness of the metal film 20 has exceeded the upper limit value.

Figure 14:
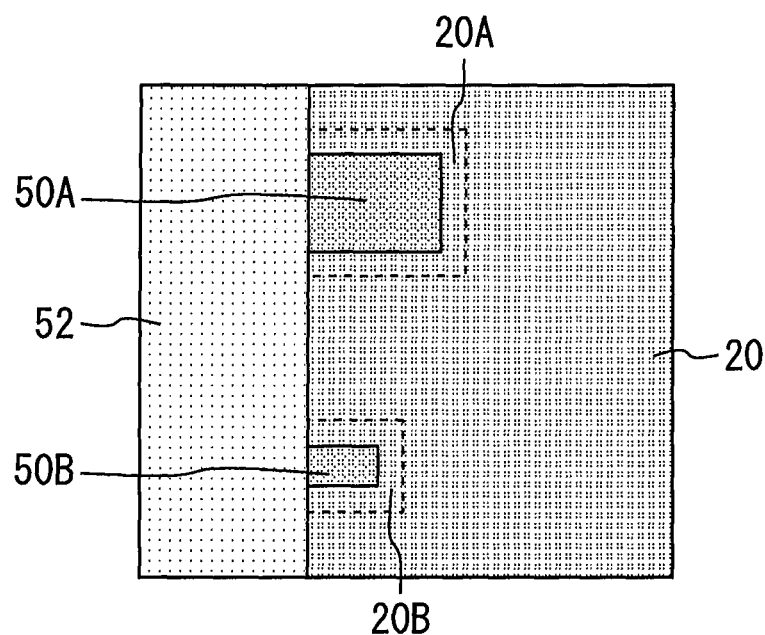
FIG. 14 illustrates the metal film whose thickness is smaller than a lower limit.

In the event that the thickness of the metal film 20 becomes below the lower limit value, as illustrated in FIG. 14, both the first reference protective film 50A and the second reference protective film 50B are exposed from the metal film 20. That is, both the first run-on portion 20A and the second run-on portion 20B exhibit the U-shape. Then, it can be determined that the thickness of the metal film 20 becomes below the lower limit by observing that both the first reference protective film 50A and the second reference protective film 50B are exposed.

In this embodiment, although the two reference protective films are provided, more reference protective films can be provided, whereby the thickness of the metal film 20 can be determined more accurately. A plurality of reference protective films having different sizes are provided, whereby whether or not the thickness of the metal film is reasonable can easily be determined by observing whether or not those reference protective films are covered by the metal film.

In the first to third embodiments, the metal film 20 not only functions as part of a thickness monitor but also functions as a surface electrode. Consequently, since the metal film 20 does not have to be formed only for the thickness monitor, the design of the semiconductor device can be simplified.

Fourth Embodiment

Figure 15:
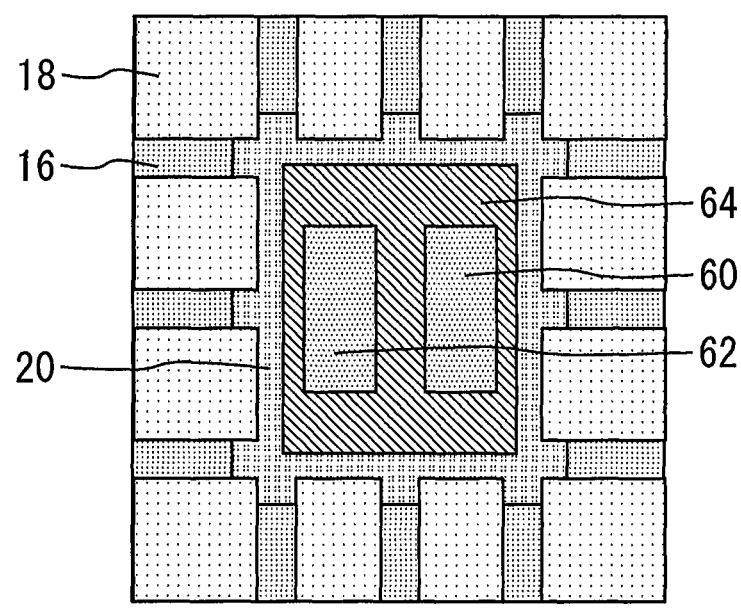
FIG. 15 is a plan view of the semiconductor device according to the fourth embodiment.

FIG. 15 is a plan view of a semiconductor device according to a fourth embodiment. The semiconductor device includes surface electrodes 60, 62 through which a current flows while the semiconductor device is in operation. An external electrode is soldered to these surface electrodes 60, 62. For example, in a form where the main body portion 20a in FIG. 4 is replaced by the surface electrodes 60, 62, an external electrode is soldered to the surface electrodes 60, 62.

An insulation film 64 is formed around peripheries of the surface electrodes 60, 62. A metal film 20 is formed around peripheries of the insulation film 64. The metal film 20 and the surface electrodes 60, 62 are separated by the insulation film 64. An area surrounded by the insulation film 64 is an effective area called a cell area, and an area outside the insulation film 64 is a non-effective area which does not contribute directly to operation of the semiconductor device.

The metal film 20, a first protective film 16 and a second protective film 18 are structures corresponding to the thickness monitor described in the first and second embodiments. That is, a plurality of constructions like the construction illustrated in FIG. 1 or FIG. 7 are formed in the non-effective area of the semiconductor device illustrated in FIG. 15. The metal film 20 and the surface electrodes 60, 62 are formed in the same electroless plating step, and therefore, a thickness of the metal film 20 and a thickness of the surface electrodes 60, 62 are equal. Consequently, whether or not the thickness of the surface electrodes 60, 62 is reasonable can be determined by determining on the thickness of the metal film 20 by forming a similar structure to those of the first and second embodiments by the first protective film 16 and the second protective film 18. The thickness monitor described in the third embodiment may be prepared in the non-effective area.

Even in the case where the thickness monitors described in the first to third embodiments cannot be designed to be provided in the effective area such as a chip, the thickness monitors are provided in the non-effective area, whereby whether or not the thickness of the surface electrodes in the effective area is reasonable can be determined. This can enhance the degree of freedom in designing a surface electrode to be provided in the effective area. The thickness monitors can be provided in the non-effective area without adding an additional step by forming the first protective film and the second protective film in the same step where the insulation film 64 is formed.

Fifth Embodiment

Figure 16:
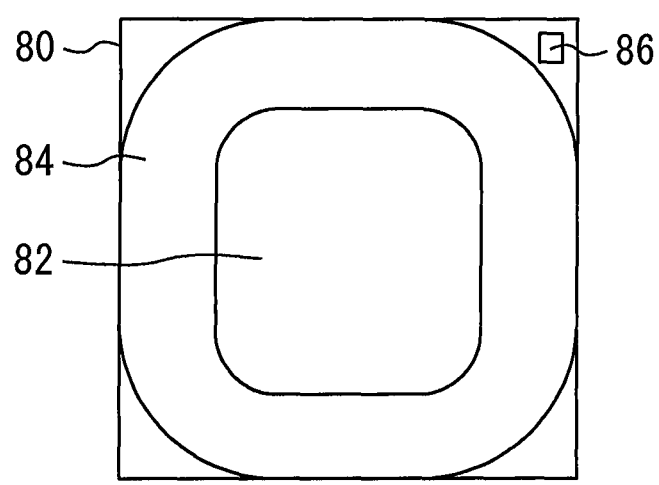
FIG. 16 is a plan view of the semiconductor device according to the fifth embodiment.

FIG. 16 is a plan view of a semiconductor device according to a fifth embodiment. A semiconductor device 80 is a chip. A cell area where a metal film 82 is formed exists at a center of the semiconductor device 80. The cell area is surrounded by a withstand voltage holding structure 84 such as a guard ring structure, for example. An area outside the withstand voltage holding structure 84 is called a terminal area. A thickness monitor 86 is formed on this terminal area.

The thickness monitor 86 is any one of the thickness monitors described in the first to third embodiments. The thickness monitor 86 includes a surface metal, provided on an outer side of the withstand voltage holding structure. A metal film formed on this surface metal is formed together with the metal film 82 simultaneously by use of the electroless plating method. An external electrode is connected to the metal film 82 through soldering. When the thickness monitor 86 is provided on a terminal area lying in a corner portion of the chip, whether or not a thickness of the metal film 82 functioning as a surface electrode is reasonable can be determined without affecting the size of the semiconductor device.

Sixth Embodiment

Figure 17:
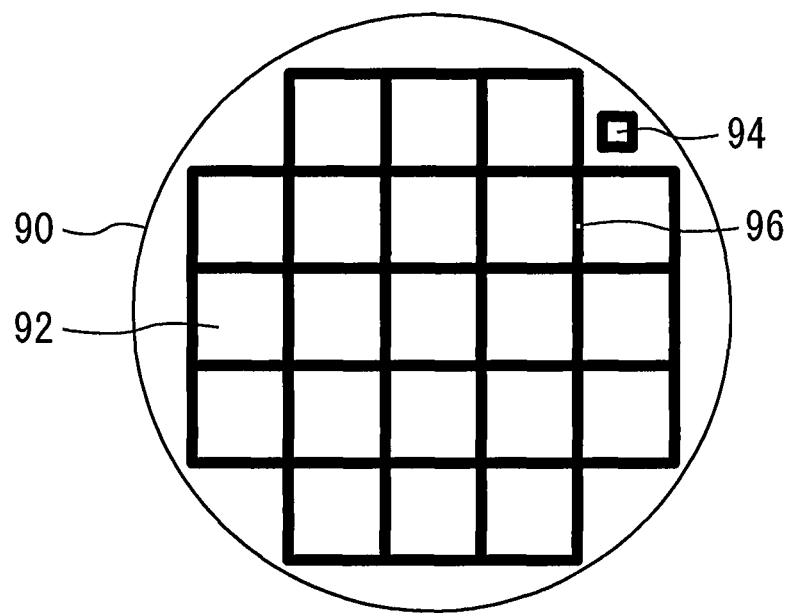
FIG. 17 is a plan view of the semiconductor device according to the sixth embodiment.

FIG. 17 is a plan view of a semiconductor device according to a sixth embodiment. A semiconductor device 90 is a wafer. A plurality of chips 92 are formed on the semiconductor device 90. A non-effective area where no chip is formed exists outside an effective area where the plurality of chips 92 are formed. A thickness monitor 94, which is any one of the thickness monitors described in the first to the third embodiments, is provided on the non-effective area. The thickness monitor 94 has a surface metal and a metal film formed on the surface metal. Surface electrodes formed on the individual chips 92 and the metal film formed on the thickness monitor are formed in the same electroless plating step. Whether or not a thickness of the surface electrodes is reasonable can be determined by forming the thickness monitor 94 on the non-effective area.

A thickness monitor 96 may be provided on a dicing line between the plurality of chips 92 in place of the thickness monitor 94. As this occurs, a metal film of the thickness monitor 96 and the surfaces electrodes of the chips 92 are formed in the same electroless plating step.

Seventh Embodiment

Figure 18:
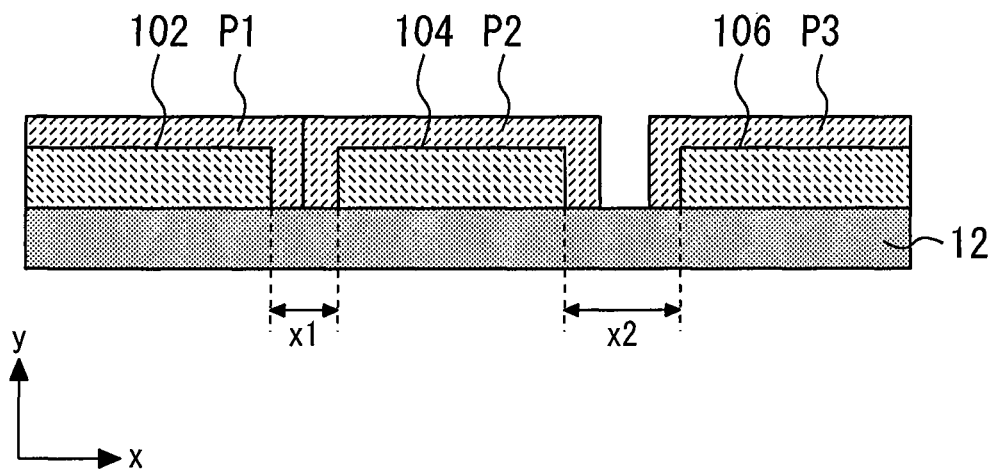
FIG. 18 is a sectional view of a thickness monitor portion of a semiconductor device according to a seventh embodiment.

FIG. 18 is a sectional view of a thickness monitor portion of a semiconductor device according to a seventh embodiment. Pads 102, 104, 106 are formed on a substrate 12 in such a way that the pads are provided at different intervals. The pads 102, 104, 106 are formed of aluminum, for example. The pads 102, 104, 106 should be formed of a material in which a plating film does not grow or a non-plating material and do not necessarily have to be formed of aluminum. The pads 102, 104, 106 are covered by monitor metals P1, P2, P3, respectively. As illustrated in FIG. 4, a main body portion 20a of a metal film which functions as a surface electrode and an external electrode 32 fixed to the surface electrode with a solder 30 are formed on the substrate 12.

The monitor metals P1, P2, P3 and the surface electrode are formed together simultaneously by use of the electroless plating method, whereby the monitor metals P1, P2, P3 and the surface electrode are formed of the same material and have the same thickness. Then, an interval between the pads 102 and 104 is caused to coincide with a value resulting from doubling a lower limit value of a thickness of the surface electrode, and an interval between the pads 104 and 106 is caused to coincide with a value resulting from doubling an upper value of the thickness of the surface electrode. This allows whether or not a plating thickness of the surface electrode is reasonable to be determined by an electric characteristics test testing for a leakage current, resistance and capacity between the pads.

For example, probes are placed on the pad 102 and the pad 104 to measure a resistance, and when a resistance value which is smaller than a predetermined value is detected, it can be determined that the pads 102, 104 are connected together by the monitor metals P1, P2. In this case, the thickness of the surface electrode is larger than the lower limit value. On the other hand, the probes are placed on the pad 102 and the pad 104 to measure a resistance, and when a resistance value which is larger than the predetermined value is detected, it can be determined that the pads 102, 104 are not connected together by the monitor metals P1, P2. In this case, the thickness of the surface electrode is smaller than the lower limit value.

Thereafter, the probes are placed on the pad 104 and the pad 106 to measure a resistance value, and when a resistance value which is larger than a predetermined value is detected, it can be determined that the pads 104, 106 are not connected together by the monitor metals P2, P3. In this case, the thickness of the surface electrode is smaller than the upper limit value. On the other hand, the probes are placed on the pad 104 and 106 to measure a resistance value, and when a resistance value which is smaller than the predetermined value is detected, it can be determined that the pads 104, 106 are connected together by the monitor metals P2, P3. In this case, the thickness of the surface electrode is larger than the upper limit value.

In this way, by measuring the resistances and the like between the pads, whether or not the thickness of the metal film functioning as the surface electrode is reasonable can be determined easily. Although an external appearance inspection for minute patterns becomes necessary for the semiconductor devices of the first to sixth embodiments, since the necessity of carrying out an external inspection is obviated by measuring resistances in the seventh embodiment, the manufacturing time and cost can be reduced.

As illustrated in FIG. 18, the intervals between the pads are preferably determined so that the fact that the thickness of the surface electrode is larger than the lower limit value can be determined by confirming that the two pads 102, 104 are connected together by the monitor metals P1, P2 and the fact that the thickness of the surface electrode is smaller than the upper limit value by confirming that the two pads 104, 106 are not connected together by the monitor metals P2, P3 and are hence electrically insulated from each other. In FIG. 18, the number of pads is three; however, four or more pads can be provided so as to enhance the accuracy with which the thickness of the surface electrode is determined.

Eighth Embodiment

Figure 19:
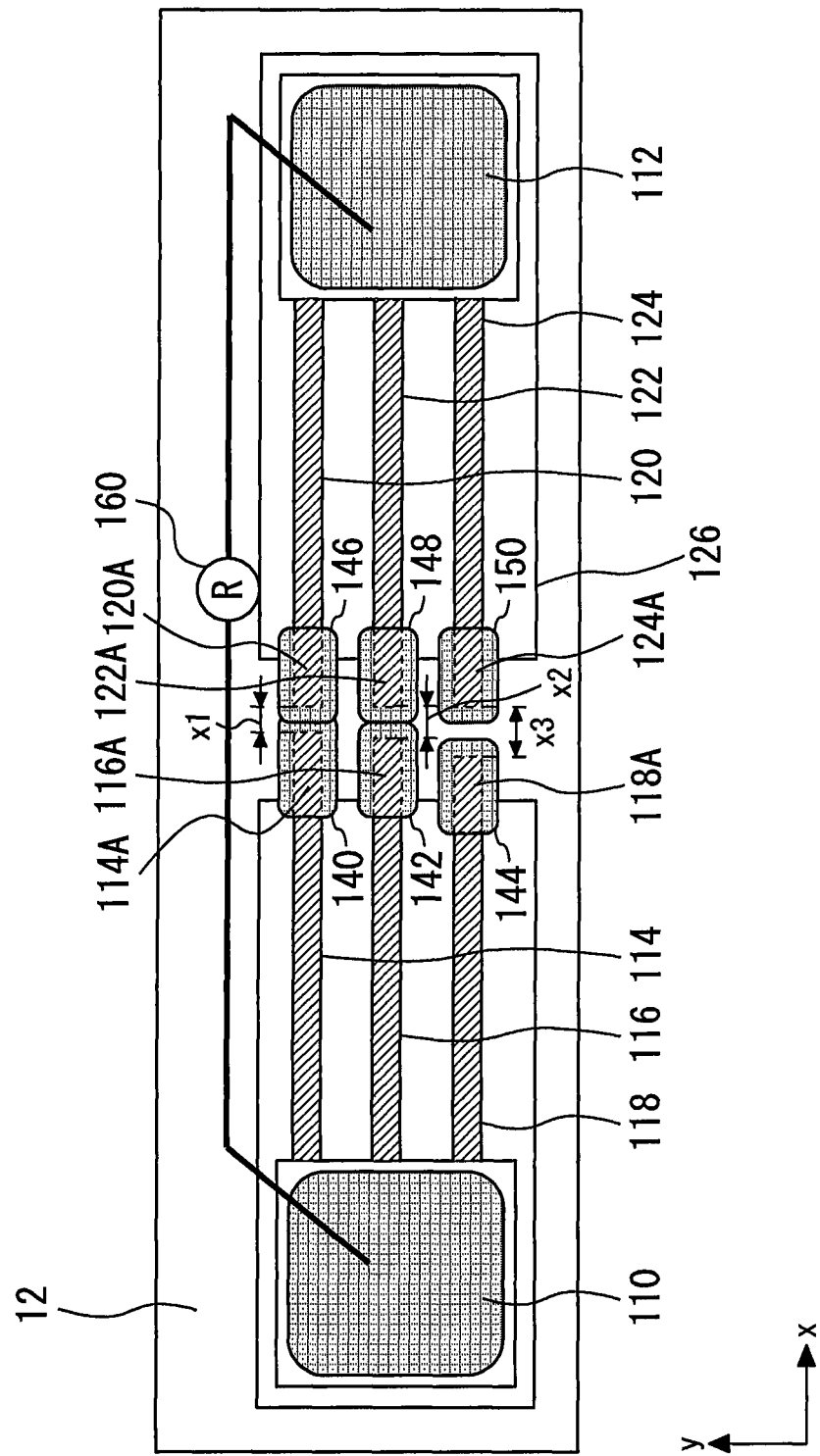
FIG. 19 is a plan view of a thickness monitor portion of a semiconductor device according to an eighth embodiment.

FIG. 19 is a plan view of a thickness monitor provided on a semiconductor device according to an eighth embodiment. As with the seventh embodiment, a semiconductor device according to the eighth embodiment includes a surface electrode and an external electrode soldered to the surface electrode in an area which is different from an area where a thickness monitor is formed.

Referring to FIG. 19, a thickness monitor formed on a substrate 12 will be described. This thickness monitor includes a first pad 110 formed on the substrate 12 and a second pad 112 which is formed on the substrate 12 so as to be spaced away from the first pad 110. Wirings 114, 116, 118 are connected to the first pad 110. Wirings 120, 122, 124 are connected to the second pad 112. All the wirings are formed, for example, of aluminum.

Most of the wirings 114, 116, 118, 120, 122, 124 are covered by a protective film 126 which is formed of a material in which a plating film does not grow or a non-plating material. Portions of the wirings 114, 116, 118, 120, 122, 124 which are not covered by the protective film 126 are distal end portions 114A, 116A, 118A, 120A, 122A, 124A of the wirings. The distal end portion 114A faces the distal end portion 120A, the distal end portion 116A faces the distal end portion 122A, and the distal end portion 118A faces the distal end portion 124A.

A distance x1 between the distal end portion 114A and the distal end portion 120A, a distance x2 between the distal end portion 116A and the distal end portion 122A and a distance x3 between the distal end portion 118A and the distal end portion 124A satisfy x1<x2<x3. Metals 140, 142, 144, 146, 148, 150 are formed on the distal end portions 114A, 116A, 118A, 120A, 122A, 124A, respectively.

The metal film functioning as the surface electrode, the metals 140, 142, 144, 146, 148, 150, the first pad 110 and the second pad 112 are formed in the same electroless plating step. Thus, these constituent elements are formed of the same material and have the same thickness. For example, when a target of the thickness of the surface electrode is 2±1 µm, x1 is 4 µm, x2 is 5 µm, and x3 is 6 µm.

When the electroless plating step is completed, probes of a resistance measurement device 160 are placed on the first pad 110 and the second pad 112 to measure a resistance. A resistance resulting when the wiring 114 and the wiring 120 are connected together by the metals 140, 146 is R1, a resistance resulting when the wiring 116 and the wiring 122 are connected together by the metals 142, 148 is R2, and a resistance resulting when the wiring 118 and the wiring 124 are connected together by the metals 144, 150 is R3.

When a resistance is measured by the resistance measurement device 160, resistances below are measured according to the connecting situations of the wirings.

When the thickness of the surface electrode is smaller than 2.0 µm: open

When the thickness of the surface electrode is 2.0 µm or larger and smaller than 2.5 µm: R1

When the thickness of the surface electrode is 2.5 µm or larger and smaller than 3.0 µm: Parallel component of R1 and R2

When the thickness of the surface electrode is 3.0 µm or larger: Parallel component of R1 and R2 and R3

In this way, whether or not the thickness of the metal film functioning as the surface electrode is reasonable can be determined easily as a result of the resistance value detected by the resistance measurement device 160 changing according to the thickness of the surface electrode. Although a plurality of times of measuring a resistance is necessary in the seventh embodiment, in the eighth embodiment, whether or not the thickness of the metal film is reasonable can be determined by measuring a resistance only once.

It is preferable that the number of wirings is increased and the wirings are arranged to face at a variety of distances in order to enhance the accuracy with which the thickness of the metal film is measured. However, to reduce the thickness monitor in size, it is preferable that a first wiring and a second wiring are connected to a first pad, while a third wiring and a fourth wiring are connected to a second pad. As this occurs, the first wiring is caused to face the third wiring, while the second wiring is caused to face the fourth wiring, and a distance between the first wiring and the third wiring and a distance between the second wiring and the fourth wiring are set at different values. Then, first to fourth metals are formed on the first to fourth wirings, respectively, at the same time as the surface electrode is formed, whereby whether or not the thickness of the metal film is reasonable is determined whether or not the pairs of wirings are connected together.

For example, the first to fourth wirings can be formed so that a width of the first wiring and the third wiring differs from a width of the second wiring and the fourth wiring. As this occurs, since a resistance resulting when the first wiring and the third wiring are connected together differs from a resistance resulting when the second wiring and the fourth wiring are connected together, the determination by the resistance measurement device 160 is facilitated. The "width" means a length in a y direction in FIG. 19.

The number of wirings, the distances between the wirings and the widths of the wirings can be changed according to a measuring accuracy required. The semiconductor devices described in the first to eighth embodiments can be modified variously within a range where their characteristics are not lost. In addition, the technical characteristics described in the first to eighth embodiments may be combined for use.

DESCRIPTION OF SYMBOLS 14 surface metal, 16 first protective film, 18 second protective film, 18a first portion, 18b second portion, 20 metal film, 20a main body portion, 20b run-on portion, LA, LD reference line, LB contact line, LC measurement line, 30 solder, 32 external electrode

The invention claimed is:
1. A semiconductor device comprising:
a surface metal formed on a substrate;
a first protective film formed on the surface metal;

a second protective film that is transparent to light, the second protective film having a first portion provided on the first protective film and a second portion continuing to the first portion and provided on the surface metal; and a metal film having a main body portion provided on the surface metal and a run-on portion continuing to the main body portion and running onto the first protective film, wherein the main body portion is thicker than the first protective film, the first portion is thicker than the run-on portion, and the second portion is thicker than the main body portion.

2. The semiconductor device according to claim 1, wherein in plan view, a contact line is a boundary line between the first protective film and the main body portion, and a reference line which is a boundary line between the first protective film lying underneath the second protective film and the surface metal lying underneath the second protective film is parallel to the contact line.

3. The semiconductor device according to claim 1, wherein in plan view, a contact line is a boundary line between the first protective film and the main body portion, a reference line is a boundary line between the first protective film lying underneath the second protective film and the surface metal lying underneath the second protective film and the reference line and the contact line form a single straight line.

4. The semiconductor device according to claim 2, wherein two of the second protective films are provided so as to hold the run-on portion between the two second protective films, such that two of the reference lines are provided, and wherein the two reference lines are parallel.

5. The semiconductor device according to claim 4, wherein the contact line lies closer to the main body portion than the two reference lines.

6. The semiconductor device according to claim 5, wherein in plan view, a measurement line which is a boundary line between the run-on portion that overlaps the first protective film and the first protective film, lies between the two reference lines.

7. The semiconductor device according to claim 1, wherein a material of the first protective film is glass, SiN, Ti or W, and wherein a material of the second protective film is polyimide.

8. The semiconductor device according to claim 1, comprising:

an external electrode soldered to the metal film.

9. The semiconductor device according to claim 1, comprising:

a surface electrode formed on the substrate so as to be separated from the metal film; and an external electrode soldered to the surface electrode.

10. The semiconductor device according to claim 9, comprising:

a withstand voltage holding structure formed so as to surround the surface electrode, wherein the surface metal is provided outside the withstand voltage holding structure.

11. The semiconductor device according to claim 9, wherein the surface metal is formed on a non-effective area of a wafer, the non-effective area being outside an effective area of the wafer where at least one chip is formed.

12. The semiconductor device according to claim 9, wherein the surface metal is formed on a dicing line.

13. A semiconductor device comprising:

a surface metal formed on a substrate;

a first reference protective film formed on the surface metal;

a second reference protective film formed on the surface metal and having an area which is smaller than that of the first reference protective film;

a support protective film configured to cover partially the first reference protective film and the second reference protective film; and a metal film having a main body portion provided on the surface metal, a second run-on portion continuing to the main body portion and running onto an entire portion of an upper surface of the second reference protective film, the upper surface of the second reference protective film being not covered by the support protective film, and a first run-on portion continuing to the main body portion and running onto part of a portion of an upper surface of the first reference protective film, the upper surface of the first reference protective film being not covered by the support protective film.

14. The semiconductor device according to claim 13, wherein the first run-on portion is formed in a U-shape in plan view.

15. A semiconductor device comprising:

a surface electrode formed on a substrate;

an external electrode soldered to the surface electrode; and a thickness monitor formed on the substrate;

wherein the thickness monitor has:

a plurality of pads provided at different intervals; and a monitor metal covering the plurality of pads and formed of the same material as a material of which the surface electrode is formed.

16. The semiconductor device according to claim 15, wherein two pads in the plurality of pads are connected together by the monitor metal, and wherein another two pads in the plurality of pads are electrically insulated from each other.

17. A semiconductor device comprising:

a surface electrode formed on a substrate;

an external electrode soldered to the surface electrode; and a thickness monitor formed on the substrate, wherein the thickness monitor comprises:

a first pad formed on the substrate;

a second pad formed on the substrate and formed so as to be spaced away from the first pad;

a first wiring connected to the first pad;

a second wiring connected to the first pad;

a third wiring connected to the second pad;

a fourth wiring connected to the second pad;

a first metal formed on the first wiring;

a second metal formed on the second wiring;

a third metal formed on the third wiring; and a fourth metal formed on the fourth wiring, wherein a distance between the first wiring and the third wiring differs from a distance between the second wiring and the fourth wiring, and wherein the surface electrode, the first metal, the second metal, the third metal and the fourth metal are formed of the same material.

18. The semiconductor device according to claim 17, wherein a width of the first wiring and the third wiring differs from a width of the second wiring and the fourth wiring.

* * * * *